United States Patent

Sakurada et al.

[11] Patent Number: 6,071,337
[45] Date of Patent: Jun. 6, 2000

[54] APPARATUS AND METHOD FOR PRODUCING CRYSTALS BY THE CZOCHRALSKI METHOD AND CRYSTALS PRODUCED BY THIS METHOD

[75] Inventors: Masahiro Sakurada, Fukushima-ken; Yuichi Miyahara, Fukui-ken; Tomohiko Ohta, Fukushima-ken, all of Japan

[73] Assignee: Shin-Etsu Handotai Co., Ltd, Tokyo, Japan

[21] Appl. No.: 09/125,339

[22] PCT Filed: Feb. 12, 1997

[86] PCT No.: PCT/JP97/00359

§ 371 Date: Aug. 14, 1998

§ 102(e) Date: Aug. 14, 1998

[87] PCT Pub. No.: WO97/30195

PCT Pub. Date: Aug. 21, 1997

[30] Foreign Application Priority Data

Feb. 14, 1996  [JP]  Japan ................................. 8-050898

[51] Int. Cl.[7] ................................................. C30B 15/20
[52] U.S. Cl. ......................... 117/13; 117/20; 117/937; 117/954; 423/328.1
[58] Field of Search ................. 117/13, 14, 15, 117/20, 937, 954

[56] References Cited

U.S. PATENT DOCUMENTS

| | | | |
|---|---|---|---|
| 4,824,519 | 4/1989 | Ostrogorski | 117/217 |
| 5,248,378 | 9/1993 | Oda et al. | 117/217 |
| 5,817,171 | 10/1998 | Sakurada et al. | 117/217 |

FOREIGN PATENT DOCUMENTS

| | | | |
|---|---|---|---|
| 4-05024979 | 2/1993 | Japan | 117/217 |
| 5-070283 | 3/1993 | Japan | C30B 15/14 |
| 7-002594 | 1/1995 | Japan | C30B 27/02 |
| 8-002993 | 1/1996 | Japan | C30B 15/00 |
| 8-026879 | 1/1996 | Japan | C30B 15/00 |
| 8-337491 | 12/1996 | Japan | C30B 15/00 |
| 9-040492 | 2/1997 | Japan | C30B 27/02 |

OTHER PUBLICATIONS

Yamagishi, H., I. Fusegawa, K. Takano, N. Fujimaki, T. Ohta and M. Sakurada, "The Effect of Grown–In Defects on Micro Particle Monitoring," Shin–Etsu Handotai Co., Ltd.

Fujimaki, Nobuyoshi, Izumi Fusegawa, Kiyotaka Takano, Masaki Kimura and Hirotoshi Yamagishi, "Influence of Micro Crystal Defect in Silicon Single Crystal on Gate Oxide Integrity," pp. 23–33.

*Primary Examiner*—Felisa Garrett
*Attorney, Agent, or Firm*—Loeb & Loeb, LLP

[57] ABSTRACT

A method and apparatus for producing crystals by the Czochralski method whereby the thermal history during crystal growth according to the CZ method can be controlled with ease and accuracy. The apparatus comprises a crucible for receiving a raw material, a heater for heating and melting the raw material, and a heat insulating cylinder disposed so as to surround the crucible and the heater, wherein a portion of the heat insulating cylinder that is located above an upper end of the heater is so configured that its inner diameter is larger than the outer diameter of the heater at its lower end, and that its inner diameter at its upper end is equal to or less than the inner diameter of the heater while its outer diameter is equal to or greater than the outer diameter of the heater. This apparatus is used to produce crystals and to control the temperature distribution inside the crystal producing apparatus or the thermal history of crystals.

10 Claims, 3 Drawing Sheets

APPARATUS AND METHOD FOR PRODUCING CRYSTALS BY THE CZOCHRALSKI METHOD AND CRYSTALS PRODUCED BY THIS METHOD

CROSS REFERENCE TO RELATED APPLICATION

This application claims priority based on PCT Application No. PCT/JP97/00359, filed Feb. 12, 1997 identifying the United States as an elected country which in turn claims priority based on Japanese Patent Application No. 8-50898, filed Feb. 14, 1996.

FIELD OF THE INVENTION

The present invention relates to an apparatus used for growing crystals by the Czochralski (CZ) method, and to a method for producing crystals by use of the apparatus.

BACKGROUND ART

In recent years, with increasing in the degree of integration and precision of semiconductor devices, quality requirements for semiconductor crystal substrates have tended to become stricter. Semiconductor crystals are primarily produced by the CZ method, and every effort has been made to produce crystals having higher purity, lower defect density, and higher uniformity. Recently, it has been found that crystal defects are closely related not only to purity of a raw material, purity of a member used, and precision of an apparatus, but also to the thermal history of a crystal during its growth. For example, for silicon, thermal history has an effect on OSF (Oxidation Induced Stacking Faults), oxygen precipitation, BMD (Bulk Micro-Defect), FPD (Flow Pattern Defect), LSTD (Laser Scattering Tomography Defect), and the oxide dielectric breakdown voltage. Also, for compound semiconductors such as GaP, GaAs, and InP, thermal history has a considerable effect on dislocation density and the level of such defects as functioning as a donor or an acceptor. Accordingly, there have been proposed crystal-producing apparatuses having a variety of furnace structures that control defects in crystals through adjustment of thermal history during crystal growth (refer to, for example, H. Yamagishi, I Fusegawa, K. Takano, E. Iino, N. Fujimaki, T. Ohta, and M. Sakurada, Proceedings of the 17th International Symposium on Silicon Materials Science and Technology, SEMICONDUCTOR SILICON 1994, PP.124–135).

However, according to the proposed apparatuses or methods, only the temperature at a certain position within a furnace can be increased or decreased, i.e. the entire temperature distribution within a furnace cannot be adjusted. Further, this control of temperature at a certain position within the furnace is such that the temperature of an entire grown crystal is increased or decreased. That is, this temperature control has no degrees of freedom, and its accuracy is poor. In addition, controlling a temperature only in a specific temperature region is extremely difficult. Also, when a temperature distribution must be changed in order to meet a new design requirement, an apparatus must be redesigned from the beginning.

The present inventors found that when the heat insulating cylinder surrounding a crucible and a heater used in the CZ method has a structure such that it is vertically divided so that a gap is formed between the divisions, the thermal history of a crystal and a temperature distribution within a furnace can be controlled, thereby solving the above-described problems. Based on this finding, the present inventors have proposed an improved technique disclosed in Japanese Patent Application No. 7-143586.

However, the results of further experiments conducted by the inventors show that although the above invention permits precise control of the thermal history of a crystal and a temperature distribution within a furnace in most temperature regions, when a crystal must be grown to have a thermal history such that the cooling rate is sufficiently decreased in a specific temperature region, a controllable temperature region is unexpectedly narrow due to insufficient heat retaining capability.

Recently, it has also been reported that crystal defects induced during crystal growth disappear when the cooling rate is sufficiently decreased in a specific temperature region (refer to Fujimaki et al., "Effect of Micro-Defect in a Single Crystal of Silicon on Oxide Film," UCS Semiconductor Substrate Technology Workshop, ULTRACLEAN TECHNOLOGY, Vol. 7, Issue 3, pp. 26-). Thus, there has been demand for an apparatus for producing crystals in accordance with the CZ method in which only a specific temperature region is cooled accurately at a sufficiently decreased rate.

The present invention has been accomplished to solve the above-described problems, and an object of the present invention is to provide an apparatus and method for producing crystals whereby the thermal history during crystal growth according to the CZ method can be controlled with ease and accuracy, particularly to provide an apparatus and method for producing crystals whereby the cooling rate in a specific temperature region can be decreased sufficiently.

SUMMARY OF THE INVENTION

To achieve the above object, a first embodiment of the present invention provides an apparatus for producing crystals according to the Czochralski method which comprises a crucible for containing a raw material, a heater for heating and melting the raw material, and a heat insulating cylinder disposed so as to surround the crucible and the heater, wherein a portion of the heat insulating cylinder that is located above an upper end of the heater is so configured that its inner diameter is larger than the outer diameter of the heater at its lower end, that its inner diameter at its upper end is equal to or less than the inner diameter of the heater while its outer diameter is equal to or greater than the outer diameter of the heater, and that the inner diameter gradually decreases towards the top.

This configuration of the upper end of the heat insulating cylinder can efficiently prevent heat generated by the heater from escaping vertically upward, so that the cooling rate in a specific temperature region can be decreased sufficiently.

A second embodiment of the present invention provides an apparatus for producing crystals according to the Czochralski method which comprises a crucible for containing a raw material, a heater for heating and melting the raw material, and a heat insulating cylinder disposed so as to surround the crucible and the heater, wherein a portion of the heat insulating cylinder that is located above an upper end of the heater is so configured that its inner diameter is larger than the outer diameter of the heater at its lower end, that its inner diameter at its upper end is equal to or less than the inner diameter of the heater, and that the inner wall is tapered such that the inner diameter gradually decreases towards the top.

When the inner wall of the top portion of the heat insulating cylinder is tapered in such a manner, heat generated by the heater is efficiently prevented from escaping vertically upward, and a temperature distribution in this area is made more uniform without a point of inflection.

A third embodiment of the present invention provides an apparatus for producing crystals according to the Czochralski method which comprises a crucible for containing a raw material, a heater for heating and melting the raw material, and a heat insulating cylinder disposed so as to surround the crucible and the heater, wherein a portion of the heat insulating cylinder that is located above an upper end of the heater is so configured that its inner diameter is larger than the outer diameter of the heater at its lower end, that its inner diameter at its upper end is equal to or less than the inner diameter of the heater while its outer diameter is equal to or greater than the outer diameter of the heater, and that the inner wall is tapered such that the inner diameter gradually decreases towards the top.

Since the second embodiment has a structural feature such that the outer diameter of the heat insulating cylinder at its upper end is equal to or greater than the outer diameter of the heater, a sufficient thickness is provided to the heat insulating cylinder at its upper end, so that heat generated by the heater is efficiently prevented from escaping vertically upward, and a heat retaining property in this area can be secured.

A fourth embodiment of the invention provides an apparatus for producing crystals according to the Czochralski method according to the first to third embodiments, wherein the heat insulating cylinder is formed of a carbon-fiber molding material.

As described above, the present invention is characterized by the configuration of the heat insulating cylinder. But, carbon-fiber formed materials may be used as materials of the heat insulating cylinder, which are generally used for heat insulating cylinders used in the Czochralski method. They have the advantages of being readily available and easy to process.

A fifth embodiment of the invention provides an apparatus for producing crystals according to the Czochralski method according to the first to fourth embodiments, wherein the heat insulating cylinder is vertically divided so that a gap is formed between the divisions.

This gap permits heat to escape in a horizontal direction at a certain position, to thereby enable control of a temperature distribution within a furnace and the thermal history of a crystal.

A sixth embodiment of the invention provides an apparatus for producing crystals according to the Czochralski method according to the fifth embodiment, wherein the heat insulating cylinder has a plurality of gaps.

When the heat insulating cylinder has a plurality of gaps, a temperature distribution within a furnace and the thermal history of a crystal can be controlled more freely.

A seventh, an eighth, and a ninth embodiment of the present invention provide the following methods which use an apparatus according to any of the first to sixth embodiments for producing crystals according to the Czochralski method: a method for producing a crystal of silicon, germanium, GaP, GaAs, or InP; a method for controlling a temperature distribution within the apparatus for producing crystals by the Czochralski method; and a method for controlling the thermal history of a crystal produced in accordance with the CZ method.

Use of the apparatuses for producing crystals according to the first to sixth embodiments enables control of a temperature distribution within the furnace so as to control the thermal history of a crystal being grown. Thus, the apparatus of the present invention is very useful because the generation of crystal defects induced by a thermal history is suppressed or controlled when a crystal of silicon, germanium, GaP, GaAs, or InP is produced.

A tenth embodiment of the invention provides a crystal of silicon, germanium, GaP, GaAs, or InP produced in accordance with the method according to the seventh embodiment. Since the thermal history during crystal growth is accurately controlled according to the method of the invention, the crystal has considerably high quality and features highly controlled crystal defects and the like.

As described above, the apparatus for producing crystals of the present invention can easily and accurately change or control the thermal history of a crystal produced according to the CZ method.

Thus, it is possible to eliminate crystal defects through a sufficient reduction in the cooling rate in a specific temperature region that has a strong effect on elimination of crystal defects, thereby improving the quality of crystals. Further, through an increase in the cooling rate in a high temperature region that affects the rate of crystal growth, the rate of crystal growth is increased so as to improve productivity.

Accordingly, there can be reduced or controlled thermal-history-induced crystal defects which are generated in crystals of silicon, germanium, Gap, Gaas, InP, or the like produced by the CZ method. Further, the distribution of such crystal defects can be made uniform. The present invention, therefore, significantly improves crystal quality, yield, and productivity. Thus, the present invention is very useful industrially.

BRIEF DESCRIPTION OF THE DRAWINGS

FIG. 1B is a schematic sectional view of an apparatus for producing crystals according to the embodiment of the present invention; and FIG. 1C is a schematic sectional view of an apparatus for producing crystals according to still another embodiment of the present invention in which the heat insulating cylinder has a gap between the divisions.

FIGS. 3A and 3B are schematic sectional views of conventional crystal-producing apparatuses, wherein FIG. 3A shows a fast-cooling-type crystal-producing apparatus and FIG. 3B shows a slow-cooling-type crystal-producing apparatus.

DETAILED DESCRIPTION OF THE PREFERRED EMBODIMENTS

Embodiments of the present invention will next be described in detail with reference to the drawings. But the present invention is not limited to those embodiments.

Figure 3A:
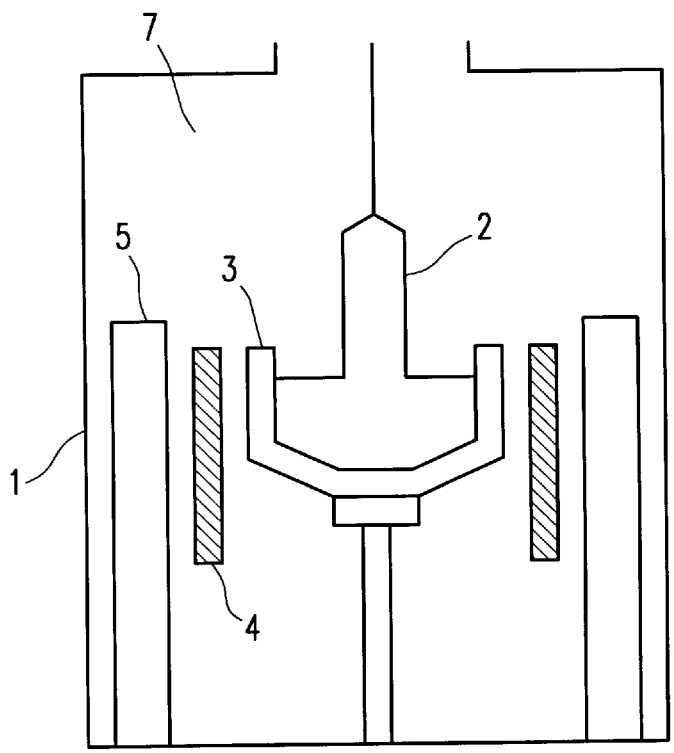
Figure 3B:
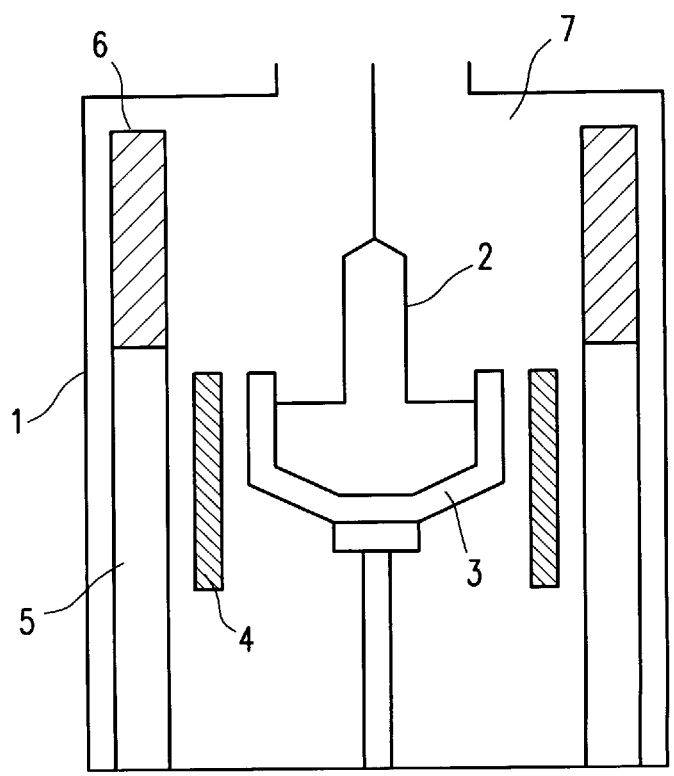

The inventors of the present invention paid attention to the structure of a heat insulating cylinder for use as an apparatus and method for changing or adjusting the thermal history of a crystal produced in accordance with the Czochralski method, in which heat insulating cylinder surrounds, for a heat retaining purpose, a crucible for containing a raw material and a heater for heating and melting the raw material. FIGS. 3A and 3B exemplify conventional apparatuses for producing crystals in accordance with the CZ method. A heat insulating cylinder 5 is normally made of a carbon-fiber formed material and is disposed so as to surround a crucible 3 for containing a raw material and a heater 4 for heating and melting the raw material.

Conventionally, in order to change the thermal history of a crystal or a temperature distribution within the furnace, the structure of the heat insulating cylinder is changed in the following manner. As shown in FIG. 3B, an upper heat insulating cylinder 6 is provided on the top of the heat insulating cylinder 5 to thereby extend the heat insulating cylinder 5 upward. Thus, heat in an upper space 7 of the crystal producing furnace is retained in order to retain the heat of a crystal 2. Alternatively, the heat insulating cylinder 5 is shortened to thereby quickly cool the crystal 2. However, these methods only provide a choice between retaining heat of a crystal and cooling the crystal, and cannot perform control within a specific temperature region. This method also has a disadvantage of providing poor accuracy of control. For example, even when it is known that crystal defects induced in a crystal during its growth disappear through a sufficient reduction in the cooling rate in a certain temperature region, the above-described methods cannot sufficiently decrease the cooling rate in the certain temperature region.

In addition, when the heat insulating cylinder is merely extended upward, heat of a crystal is retained and therefore the crystal is cooled less efficiently, so that the rate of crystal growth decreases, and productivity decreases considerably. On the other hand the mere shortening of the heat insulating cylinder deteriorates the heat retaining property of the crystal producing furnace, resulting in an increased use of electric power, damage to the furnace, and deterioration in the efficiency of production of crystals. Accordingly, as described in the aforementioned literature by H. Yamagishi et al. (1994), there have been designed crystal-producing apparatuses having a variety of furnace structures in which the thermal history of a crystal is adjusted not through use of a heat insulating cylinder but through use of other intra-furnace components.

Conventionally, since a heat insulating cylinder has such a low degree of freedom in changing its structure to thereby adjust the thermal history of a crystal, it has not been studied or improved very much except in relation to its being extended upward or shortened.

However, in view of the fact that the heat insulating cylinder 5—which surrounds the heater 4 (for example, a carbon heater, a high-frequency induction coil, etc.) and the crucible 3 (formed of, for example, quartz, graphite, or PBN) to protect a water-cooled chamber 1—has a determinant effect on a temperature distribution within a furnace operated in accordance with the CZ method, the inventors have devised the present heat insulating cylinder.

Conventionally, in order to change the thermal history of a crystal through retaining of heat in a specific temperature region in the crystal-producing apparatus shown in FIG. 3A having a conventional intra-furnace structure, the heat insulating cylinder is extended upward as shown in FIG. 3B to thereby retain heat of a crystal. However, this upward extension results in heat retention in all the temperature regions and fails to obtain a thermal history in which heat is retained only in a targeted specific temperature region. In addition, since heat generated by the heater 4 escapes vertically upward, it is impossible to sufficiently decrease the cooling rate in a specific temperature region that has a strong effect on the elimination of crystal defects. Moreover, when the heat insulating cylinder is merely extended upward to thereby lengthen the heat insulating cylinder, the temperature gradient on the crystal growth interface becomes too small, to thereby lower the rate of crystal growth and significantly deteriorate productivity of the crystal.

If the thermal history of a crystal can be changed through sufficiently retaining heat only in a targeted specific temperature region to thereby reduce crystal defects and it is prevented from affecting a high temperature region near the crystal growth interface that affects a crystal growth rate, high quality crystals having reduced crystal defects can be obtained with high speed and high productivity.

Figure 1A:
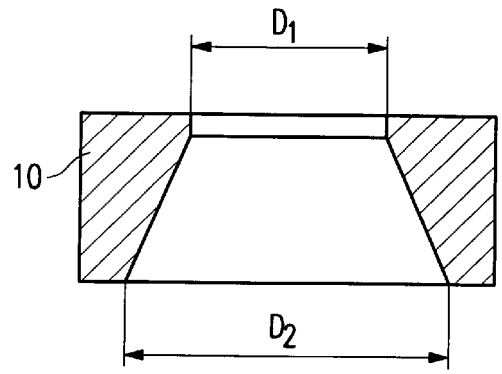
FIGS. 1A–1C are schematic sectional views of an apparatus for producing crystals according to an embodiment of the present invention, where in FIG. 1A shows an exemplary shape of a portion of the heat insulating cylinder that is located above an upper end of the heater (the upper heat insulating cylinder of the present invention)
Figure 1B:
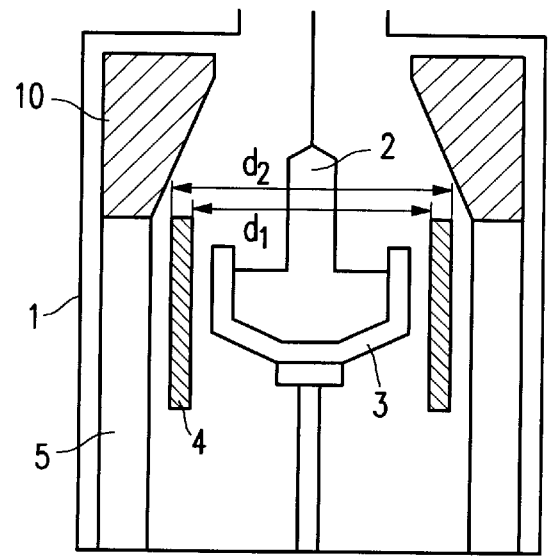
Figure 1C:
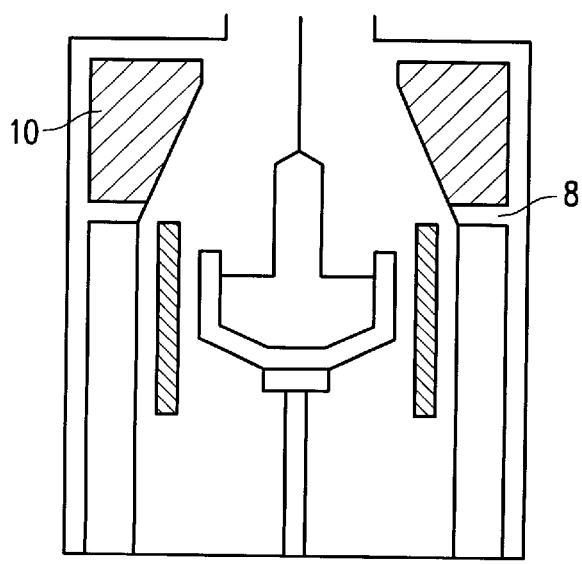

In view of the foregoing, through computation, the inventors have estimated crystal temperatures in crystal-producing apparatuses having a variety of intra-furnace structures. As a result, the inventors have found that in order to sufficiently retain heat in a specific temperature region wherein the temperature is not higher than the melting point of crystals, heat must be prevented from escaping vertically upward. In view of the above-described finding, the present invention employs structures as shown in FIGS. 1B and 1C, wherein a portion of the heat insulating cylinder 5 that is located above an upper end of the heater 4 is so configured that its inner diameter is larger than the outer diameter of the heater 4 at its lower end, and that its inner diameter at its upper end is equal to or less than the inner diameter of the heater 4. This configuration adequately prevents heat generated by the heater 4 from escaping vertically upward and reduces escape of radiant heat dissipated from the crystal surface, so that the cooling rate in a specific temperature region can be decreased sufficiently.

In this case, the outer diameter of the heat insulating cylinder (the upper heat insulating cylinder 10) at its upper end is preferably equal to or greater than the outer diameter of the heater 4. This structure provides a sufficient thickness to the heat insulating cylinder at its upper end, so that heat generated by the heater is efficiently prevented from escaping vertically upward, and a good degree of heat retention is provided in this area.

As shown in FIG. 1B, when a portion of the heat insulating cylinder that is located above an upper end of the heater (the upper heat insulating cylinder 10) is so configured that its inner wall is tapered, i.e. the inner diameter of the portion of the heat insulating cylinder decreases gradually towards the top, heat generated by the heater 4 is efficiently prevented from escaping vertically upward, and a temperature distribution in this area can be made more uniform without a point of inflection.

Also, it has been found that the cooling rate in a high temperature region affecting a crystal growth rate can be increased when the heat insulating cylinder surrounding the heater 4 is vertically divided so that there is formed a gap 8 as shown in FIG. 1C. Thus, the cooling rate can be decreased sufficiently in only a specific temperature region, to thereby reduce crystal defects. Since the cooling rate is not decreased in all the other temperature regions, particularly a temperature region near the melting point that affects a crystal growth rate, the rate of crystal growth can be sufficiently high and productivity does not deteriorate.

The above-described effect is achieved through the following actions. Since the inner diameter of the heat insulating cylinder at its upper end is equal to or less than the inner diameter of the heater 4, heat generated by the heater is prevented from escaping vertically upward, so that escape of radiant heat dissipated from crystal surface decreases, resulting in a sufficient decrease in the cooling rate in a specific temperature region. Further, heat escapes in a horizontal direction at the gap 8, and therefore radiant heat dissipated from the crystal surface near the gap 8 increases.

Therefore, the number of gaps and the position and width of each gap are important factors and may be determined in accordance with a temperature region subjected to adjustment. For example, two or more gaps may be provided. When the heat insulating cylinder is divided into vertically divisions in order to form a gap to thereby control the thermal history of a crystal being grown in accordance with the CZ method, the gap is preferably formed above the surface of a melt of a raw material contained in the crucible, so that the effect of the gap acts more directly on a crystal. However, the position of the gap is not limited thereto. The number of gaps and the position and width of each gap may be determined appropriately in order to change and control an intra-furnace temperature distribution, which has an effect on the efficiency of production of crystals.

The heat insulating cylinder may be made of a conventional carbon-fiber formed material or any other heat insulating material. Conventionally, the heat insulating cylinder is integrally made of a single kind of material and is manufactured to have a uniform thickness. However, in the present invention, the vertical divisions of the heat insulating cylinder may be made of different materials and may have different thicknesses. This arrangement enables a user to finely control a temperature distribution to thereby control the thermal history of a crystal.

The heat insulating cylinder of the present invention may be made of a fibrous material such as a carbon-fiber formed material, which is used as material for conventional heat insulating cylinders. Such a fibrous material is easy to process, and thus the heat insulating cylinder can be readily manufactured. For example, a heat insulating cylinder of the present invention may be obtained by manufacturing an upper heat insulating cylinder having a shape of an upper portion of the heat insulating cylinder of the present invention as shown in FIG. 1A and placing it on top of a conventional heat insulating cylinder.

The gap 8 in FIG. 1C may be left open or filled with a material having a high heat conductivity such as graphite.

Use of the apparatus for producing crystals of the present invention having a uniquely structured heat insulating cylinder enables control of a temperature distribution within the furnace, so that the thermal history of a crystal being grown can be controlled. Accordingly, the apparatus of the present invention is applicable to the production of various crystals, which are generally produced by the CZ method. The apparatus of the invention is particularly useful for the production of crystals of silicon, in which the thermal history of a crystal has a great effect on OSF, oxygen precipitation, BMD, FPD, LSTD, and oxide dielectric breakdown voltage, and for the production of compound semiconductors such as GaP, GaAs, and InP, in which the thermal history of a crystal has a great effect on dislocation density and a level of defects as functioning as a donor or an acceptor.

Accordingly, crystals of silicon, germanium, GaP, GaAs, and InP produced according to the present invention feature a quite high quality and highly controlled crystal defects which are attained through precise control of the thermal history during crystal growth.

Examples of the present invention will next be described.

Figure 2:
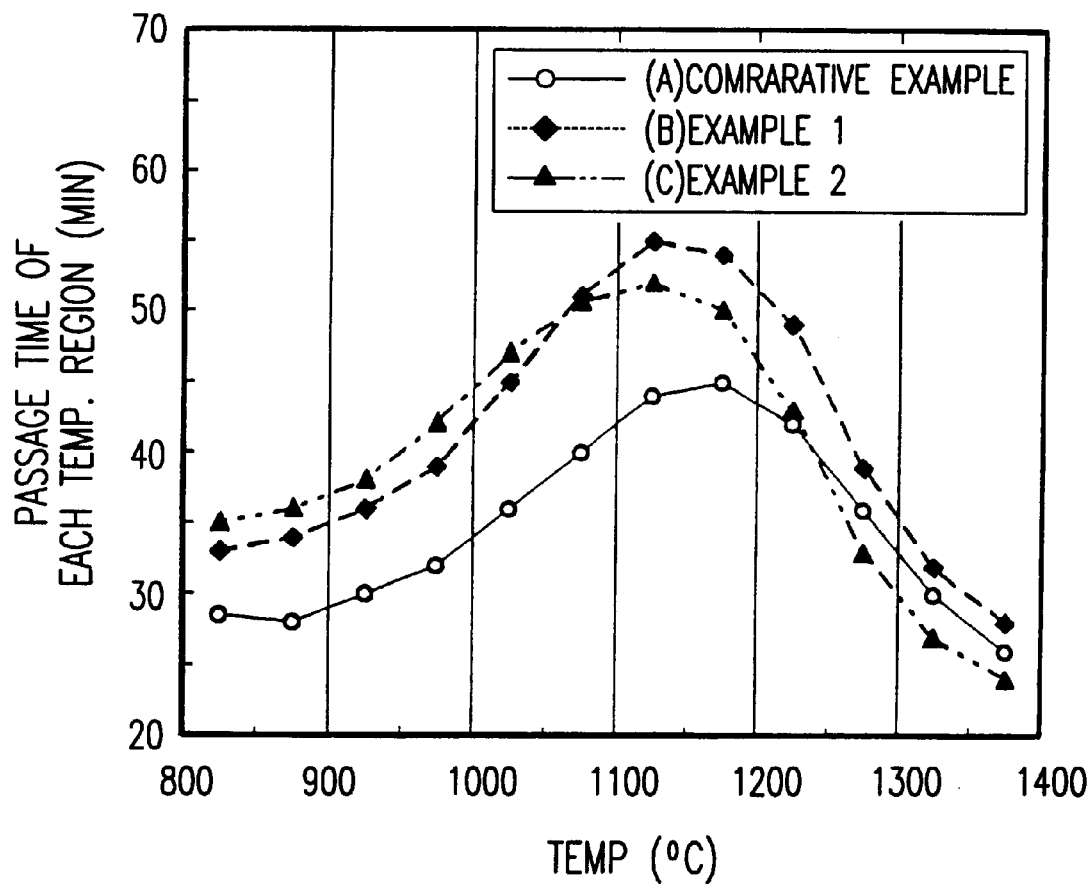
FIG. 2 is a graph showing measured thermal histories for Examples and Comparative Example.

50 kg of polysilicon material was charged into a quartz crucible having a diameter of 18 inches, and a single crystal of silicon having a diameter of 6 inches and a <100> orientation was pulled in accordance with the CZ method. There were measured the thermal history of a crystal produced through use of a crystal-producing apparatus having a conventional heat insulating cylinder and the thermal history of a crystal produced through use of a crystal-producing apparatus having a heat insulating cylinder of the present invention. A carbon heater (resistance heating) was used. FIG. 2 shows the results of measurement of the thermal history of each crystal. In FIG. 2, the vertical axis indicates the passage time of each temperature region, while the horizontal axis indicates temperature.

COMPARATIVE EXAMPLE

A crystal was pulled in a conventional crystal-producing apparatus having a slow-cooling furnace structure as shown in FIG. 3B. A heat insulating cylinder was integrally made of a carbon-fiber formed material and had a thickness of 7 cm. The result of measurement of the thermal history of the crystal is represented by curve A in FIG. 2.

EXAMPLE 1

A crystal was pulled in the crystal-producing apparatus of the present invention as shown in FIG. 1B. A portion of the heat insulating cylinder located above the upper end of the heater was so configured that its inner wall was tapered, and its inner diameter at the lower end was larger than the outer diameter of the heater by 60 mm, and its inner diameter at the upper end was less than the inner diameter of the heater by 20 mm. The result of measurement of the thermal history of the crystal is represented by curve B in FIG. 2.

From the results, it is understood that in all the temperature regions, the cooling rate decreases and more heat is retained as compared to the case of the conventional slow-cooling-type crystal-producing apparatus. Thus, the cooling rate in the temperature region that has a strong effect on the elimination of crystal defects can be decreased sufficiently, so that crystal quality can be improved.

EXAMPLE 2

A crystal was pulled in the crystal-producing apparatus of the present invention comprising a heat insulating cylinder having a gap as shown in FIG. 1D. The apparatus used in this example was the same as that used in Example 1 except that a gap was formed in the heat insulating cylinder. The gap was formed at the lower end of the tapered portion of the heat insulating cylinder to have a width of 3 cm. The result of measurement of the thermal history of the crystal is represented by curve C in FIG. 2.

As can be seen from FIG. 2, compared with the case of the conventional slow-cooling-type crystal-producing apparatus, the cooling rate is decreased sufficiently in the temperature region of 1050° C.–1200° C., while the cooling rate is increased in temperature regions not lower than 1200° C. Further, the average crystal growth rate in the Comparative Example was 0.9 mm/min., while in Example 2 the crystal was able to be pulled at a high speed of 1.2 mm/min.

Accordingly, the cooling rate could be decreased sufficiently in a specific temperature region having a strong effect on the elimination of crystal defects (1050° C.–1200° C. in this case), and by contrast the cooling rate could be increased in a high temperature region having a strong effect on a crystal growth rate.

The present invention is not limited to the above-described embodiment. The above-described embodiment is a mere sample, and those having the substantially same structure as that described in the appended claims and providing the similar action and effects are included in the scope of the present invention.

What is claimed is:

1. An apparatus for producing crystals according to a Czochralski method which comprises a crucible for containing a raw material, a heater for heating and melting the raw material, and a heat insulating cylinder disposed so as to surround the crucible and the heater, wherein a portion of the heat insulating cylinder that is located above an upper end of the heater is so configured that its inner diameter is larger than the outer diameter of the heater at its lower end, that its inner diameter at its upper end is equal to or less than the inner diameter of the heater while its outer diameter is equal to or greater than the outer diameter of the heater, and that the inner diameter gradually decreases towards the top.

2. An apparatus for producing crystals according to a Czochralski method which comprises a crucible for containing a raw material, a heater for heating and melting the raw material, and a heat insulating cylinder disposed so as to surround the crucible and the heater, wherein a portion of the heat insulating cylinder that is located above an upper end of the heater is so configured that its inner diameter is larger than the outer diameter of the heater at its lower end, that its inner diameter at its upper end is equal to or less than the inner diameter of the heater, and that the inner wall is tapered such that the inner diameter gradually decreases towards the top.

3. An apparatus for producing crystals according to a Czochralski method which comprises a crucible for containing a raw material, a heater for heating and melting the raw material, and a heat insulating cylinder disposed so as to surround the crucible and the heater, wherein a portion of the heat insulating cylinder that is located above an upper end of the heater is so configured that its inner diameter is larger than the outer diameter of the heater at its lower end, that its inner diameter at its upper end is equal to or less than the inner diameter of the heater while its outer diameter is equal to or greater than the outer diameter of the heater, and that the inner wall is tapered such that the inner diameter gradually decreases towards the top.

4. An apparatus for producing crystals according to a Czochralski method according to any one of claims 1–3, wherein the heat insulating cylinder is made of a carbon-fiber formed material.

5. An apparatus for producing crystals according to a Czochralski method according to any one of claims 1–3, wherein the heat insulating cylinder is vertically divided so that a gap is formed between the divisions.

6. An apparatus for producing crystals according to a Czochralski method according to claim 5, wherein the heat insulating cylinder has a plurality of gaps.

7. A method of using the apparatus of any of claims 1–3 to produce a crystal of silicon, germanium, GaP, GaAs, or InP, comprising:

heating a raw material contained in the crucible using the heater to produce a melt;

growing the crystal by pulling it from the melt and through a space enclosed by the portion of the heat insulating cylinder that is located above the upper end of the heater.

8. A crystal of silicon, germanium, GaP, GaAs, or InP produced in accordance with the method described in claim 7.

9. A method of using the apparatus of any of claims 1–3 to control a temperature distribution within the apparatus, comprising:

heating a raw material contained in the crucible using the heater to produce a melt;

pulling a crystal being grown from the melt and through a space enclosed by the portion of the heat insulating cylinder that is located above the upper end of the heater.

10. A method of using the apparatus of any of claims 1–3 to control the thermal history of a crystal produced using the apparatus, comprising:

heating with the heater and melting a raw material contained in the crucible;

pulling a crystal being grown from the melt and through a space enclosed by the portion of the heat insulating cylinder that is located above the upper end of the heater.

* * * * *